GATED COUNTER HAVING DIODE ISOLATING INPUT FROM GATE

Filed Nov. 27, 1962

INVENTOR.
ALAN M. DEMMERLE
BY Eugene F. Malin, Agent
Richard C. Reed
ATTORNEY

United States Patent Office 3,229,118

Patented Jan. 11, 1966

3,229,118

GATED COUNTER HAVING DIODE ISOLATING INPUT FROM GATE

Alan M. Demmerle, Washington, D.C., assignor to the United States of America as represented by the Secretary of the Navy Filed Nov. 27, 1962, Ser. No. 240,461
1 Claim. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

This invention relates to a gated counter and more particularly to a device for gating a counter in a manner providing isolation between the gate and the signal to be counted.

Heretofore, the gating of a counter was accomplished by gating the input to the counter with an "AND" gate. One approach for this type of gated crystal oscillator, operating under the constraint of a given maximum jitter, is to gate the trigger input to the first bistable multivibrator in such a way that a trigger is received only during the required gated on period. There are disadvantages to this type of system. It is advantageous to isolate, as thoroughly as possible, the crystal oscillator from any variations in load. Such variations would tend to make the oscillator less accurate. Most simple "AND" circuits, whether they be primarily of diode or transistor construction, do not have adequate isolation between their inputs to insure that the oscillator does not see an impedance which depends considerably on the state of the gate circuit. This is a primary disadvantage to this type of gating which could be avoided only by sophisticated "AND" circuit construction or by means of output isolation stages within the crystal oscillator.

It is accordingly an object of the present invention to provide isolation between the gate and the signal to be counted.

Another object is to provide a gated counting circuit providing isolation and having a minimum number of components.

A further object is to provide an improved gated counting circuit in which the gating operation can be accomplished by disabling the first stage of the counter during the off time.

These and other objects, advantages and novel features of the invention will be apparent from the following description and the accompanying drawings.

In accordance with the invention the oscillator is fed directly into the first multivibrator and a gate is used to unbalance the bistable multivibrator, during the gate off time, to the point where it is inoperative. The oscillator is now essentially isolated from effects due to the gate. The oscillator is driving nearly the same load during the off time as during the on time. The gate is fed into the base return resistor through the wiper arm of a potentiometer. The wiper arm setting is dependent on the particular transistors used.

Figure 1:
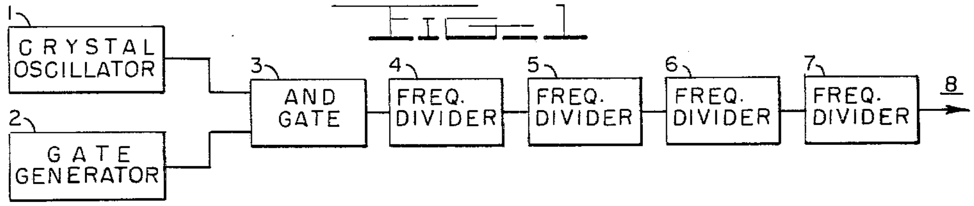
FIG. 1 shows a block diagram utilizing an "AND" gate.

Referring now to FIG. 1 the circuit was designed specifically for use in a Gated Clock Generator in which a 500 kc. electronic clock is to be gated on with a jitter of .125 $\mu$second. To limit the jitter to .125 $\mu$second, while using a highly stable oscillator, implies starting with an eight megacycle crystal oscillator and dividing this frequency by a factor of 16 to yield the 500 kc. clock frequency. Four stages of bistable multivibrators, shown at 4, 5, 6 and 7, are used for the division of 16. The crystal oscillator 1 and the gate generator 2 are connected to the "AND" gate 3, which in turn are connected to the 4 stages of bistable multivibrators 4, 5, 6 and 7. The output is shown at 8.

Figure 2:
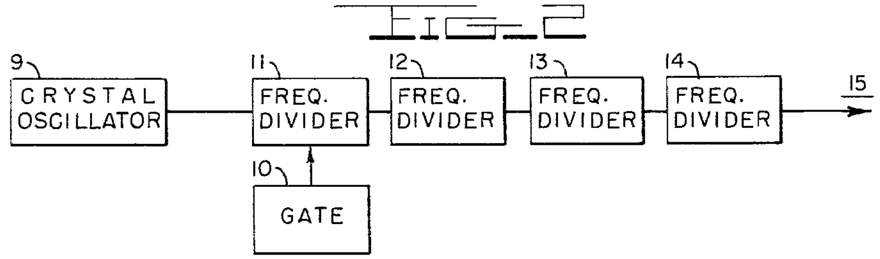
FIG. 2 shows a block diagram of the gated counting circuit.

In FIG. 2 a block diagram for isolating the crystal oscillator is shown. The crystal oscillator 9 is directly connected to the first stage multivibrator 11. The gate 10 is also connected to the multivibrator 11. The four stages 11, 12, 13, and 14 are connected in series having output 15.

Figure 3:
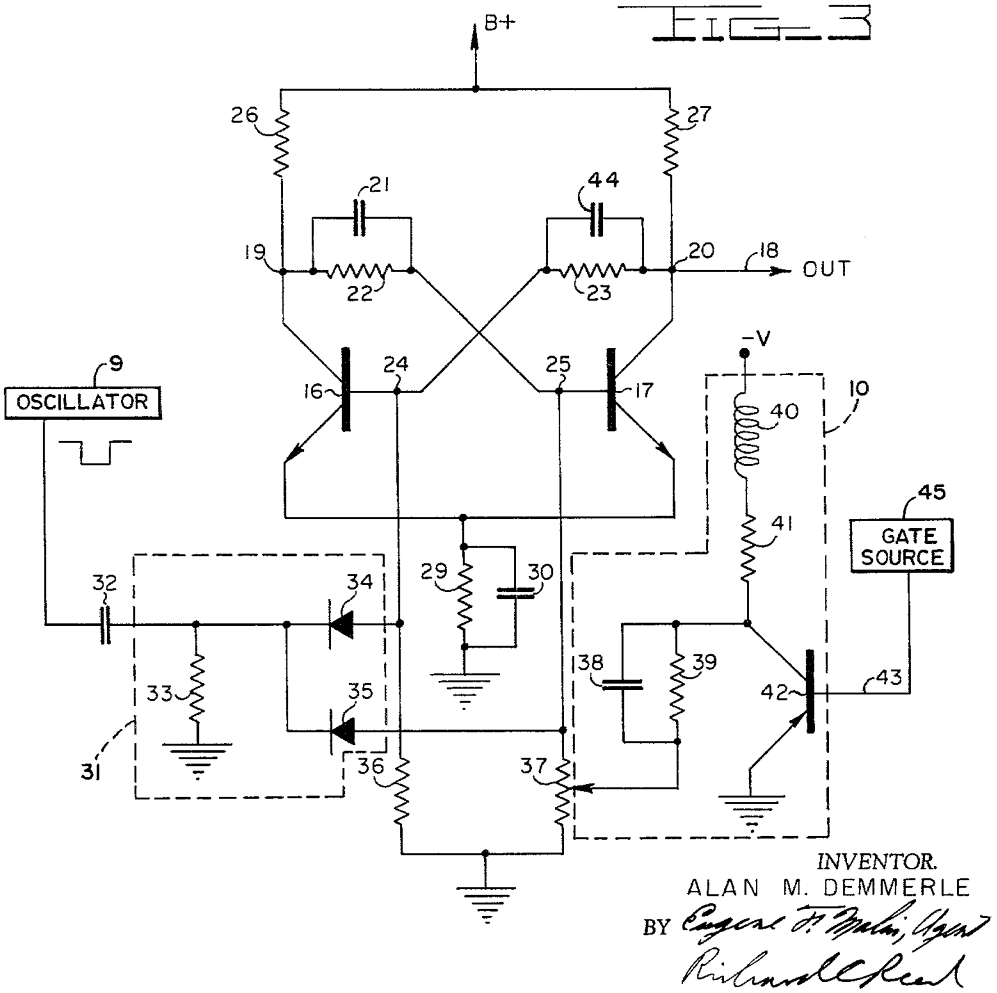
FIG. 3 is a circuit diagram of the gating circuit.

The gate circuit is shown specifically in FIG. 3. The bistable multivibrator includes transistor 16 and transistor 17. The base of transistor 16 is connected through terminal 20 to the collector of transistor 17. The base of transistor 17 is connected through terminals 19 to the collector of transistor 16. Capacitor 21 in parallel with resistor 22 is connected between terminal 19 and the base of transistor 17. The base of transistor 16 is connected to terminal 20 through resistor 23 in parallel with capacitor 44. B+ is connected to the collectors of transistor 16 and transistor 17 through load resistor 26 and load resistor 27, respectively. The output, shown at 18, is taken from terminal 20 of the stable side of the bistable multivibrator. The emitter of transistors 16 and 17 is connected to ground through resistor 19, and capacitor 30. The bistable multivibrator is unbalanced by applying a gate voltage to the base return resistor 37. Base return resistors 36 and 37 are connected to the transistors through terminals 24 and 25 respectively. Gating is effected through switching transistor 42 and base return resistor 37. Input to transistor 42 is shown at 43. The base return resistor 37 is connected to transistor 42 by resistor 39 and capacitor 38. Coil 40 and resistor 41 are connected to the collector of transistor 42.

While the gate voltage is negative, the normally bistable circuit is forced to retain only one condition, regardless of what activity is presented in the trigger circuit. The trigger circuit 31 comprises capacitor 32, resistor 33 and diodes 34 and 35 connected to transistors 16 and 17 through terminals 24 and 25. However when the gate voltage returns to nominally zero, again the bistable multivibrator is symmetrical, and is under control of the trigger circuit.

It will be apparent that the embodiment shown is only exemplary and that various modifications can be made in construction and arrangement within the scope of my invention as defined in the appended claim.

What is claimed is:

A gated counter having at least a first stage comprising:
a source of gating signals,
a D.C. voltage source,
a transistorized bistable multivibrator having first and second inputs and an output,
gating means coupled between said source of gating signals and said second input of said transistorized multivibrator, said gating means comprising a grounded emitter transistor having its base coupled to said source of gating signals and its collector coupled to said voltage source, resistor means intercoupling the collector of said transistor to said second input of said transistorized bistable multivibrator, oscillating means, and first and second diodes coupling said oscillating means to said first and second multivibrator inputs, wherein said first diode is coupled between said oscillating means and said first input, said second diode is coupled between said oscillating means and said second input and also between said oscillating means and said gating means, and said oscillating means applying the same polarity signal to said first and second diodes.

References Cited by the Examiner

UNITED STATES PATENTS

| | | | |
|---|---|---|---|
| 2,764,343 | 8/1956 | Diener | 328—195 |
| 2,909,675 | 10/1959 | Edsen | 307—88.5 |
| 2,990,451 | 6/1961 | Stoffels | 307—88.5 |

ARTHUR GAUSS, *Primary Examiner.*

B. P. DAVIS, *Assistant Examiner.*